(12) United States Patent
Ali et al.

(10) Patent No.: US 9,184,737 B1
(45) Date of Patent: Nov. 10, 2015

(54) PROCESS MITIGATED CLOCK SKEW ADJUSTMENT

(71) Applicant: Broadcom Corporation, Irvine, CA (US)

(72) Inventors: Tamer Ali, Irvine, CA (US); Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/332,106

(22) Filed: Jul. 15, 2014

Related U.S. Application Data

(60) Provisional application No. 62/013,407, filed on Jun. 17, 2014.

(51) Int. Cl.
*H03M 1/10* (2006.01)
*H03K 5/135* (2006.01)
*H03M 1/12* (2006.01)

(52) U.S. Cl.
CPC ............. *H03K 5/135* (2013.01); *H03M 1/1023* (2013.01); *H03M 1/1245* (2013.01)

(58) Field of Classification Search
CPC .... H03M 1/1023; H03M 1/1245; H03L 7/00; G11C 8/18
USPC .................................. 341/118, 120, 144, 141
See application file for complete search history.

(56) References Cited

U.S. PATENT DOCUMENTS

| | | | | |
|---|---|---|---|---|
| 5,991,347 A * | 11/1999 | Kim et al. | ...................... | 375/355 |
| 7,466,251 B2 * | 12/2008 | Uchino | ........................ | 341/120 |
| 7,808,408 B2 * | 10/2010 | Madisetti et al. | ............. | 341/118 |
| 9,000,962 B1 * | 4/2015 | Leuciuc | ....................... | 341/120 |

OTHER PUBLICATIONS

El-Chammas, Manar, Time-Interleaved ADCs Theory and Design, Texas Instruments, Dec. 11, 2011, 158 pages, Dallas, Texas.
Boris Murmann et al., EE315B VLSI Data Conversion Circuits, 376 pages, 2013.

* cited by examiner

*Primary Examiner* — Peguy Jean Pierre
(74) *Attorney, Agent, or Firm* — Brinks Gilson & Lione

(57) ABSTRACT

A device includes process mitigating timing (PMT) circuitry. The PMT circuitry allows for adjustment of a clock signal while compensating for process variation within the PMT circuitry. The PMT circuitry may include process mitigating buffer (PMB) circuitry. The PMB circuitry may utilize replica circuitry and a calibrated resistance to generate a calibrated bias voltage. The calibrated bias voltage may be used to drive component buffer circuits to create a calibrated current response. The calibrated current response may correspond to a selected output impedance for the component buffer circuits. The select output impedance may be used in concert with a variable capacitance to adjust a clock signal in manner that is independent of the process variation within the PMT circuitry.

20 Claims, 5 Drawing Sheets

PROCESS MITIGATED CLOCK SKEW ADJUSTMENT

PRIORITY CLAIM

This application claims priority to provisional application Ser. No. 62/013,407, filed 17 Jun. 2014, which is entirely incorporated by reference.

TECHNICAL FIELD

This disclosure relates clock signal skew adjustment. This disclosure also relates to adjustment of signal delay.

BACKGROUND

Rapid advances in electronics and communication technologies, driven by immense customer demand, have resulted in the worldwide adoption of high bandwidth technologies. Examples of such technologies include optical fiber networks, high speed wire-line and wireless networks. Improvements in signal processing and analysis techniques, including signal synchronization, will continue to enhance the capabilities, and hence adoption, of these technologies.

DETAILED DESCRIPTION

The disclosure below concerns techniques and architectures for achieving synchronized device timing in regimes at which the process variation among the synchronized devices may be significant. For example, when performing clock skew adjustment for interleaved analog-to-digital converters (ADCs) that are converting a datastream from a high-bandwidth signal source, the process variation among the ADCs may present challenges. For example, the delay increments for clock skew adjustment that are achievable for the individual ADCs may vary in absolute scale because of the process variation. The variance in these delay increments may result in an uneven and/or unknown sampling distribution of the sampled signal. The techniques and architectures in the disclosure below apply process mitigating timing (PMT) circuitry to allow for synchronized device timing in regimes at which the process variation among the devices may be significant. The PMT circuitry may be applied in virtually any synchronization application, such as, signal processing, high bandwidth datastream sampling, execution event sequencing among distributed processing elements, or other timing applications.

Figure 1:
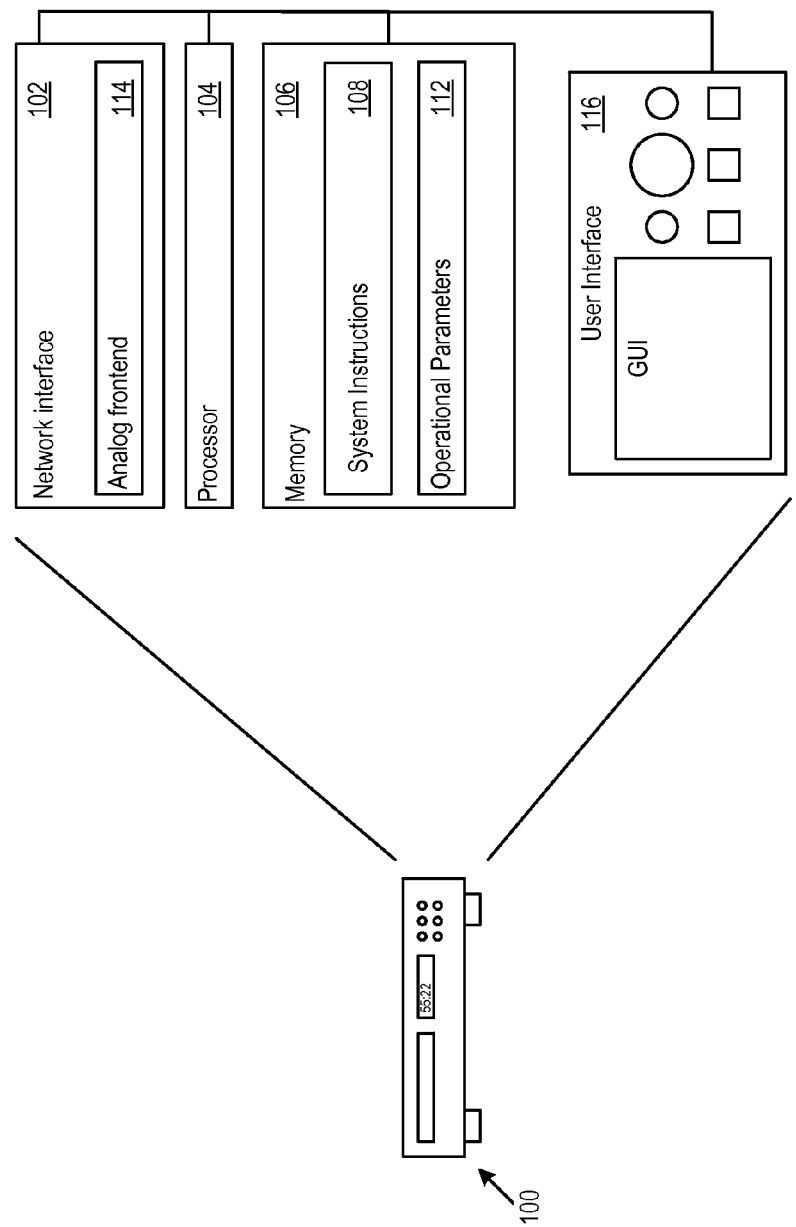
FIG. 1 shows an example device.

The example device described below provides an example context for explaining the techniques and architectures to support process mitigation in clock skew adjustment. FIG. 1 shows an example device 100. In one example, the device may be a communication device, such as a router, or server. However, the device may be virtually any device implementing datastream sampling. For example, backbone networking hardware, a gaming console, a television set-top box, or other networking device may use PMT circuitry.

The device 100 may include a network interface 102 to support network communications, and one or more processors 104 to support execution of applications and operating systems, and to govern operation of the device. Further, the processors 104 may run processes that result in signal analysis, demodulation, sampling, or other processing of a signal received at interface 102. The device 100 may include memory 106 for execution support and storage of system instructions 108 and operational parameters 112. The communication device 100 may include a user interface 116 to allow for user operation of the device. An analog frontend 114 within the network interface 102 may also be included to support transmission and reception of signals. The analog frontend 114 may include ADCs using PMT circuitry to sample the received signal at interface 102.

Figure 2:
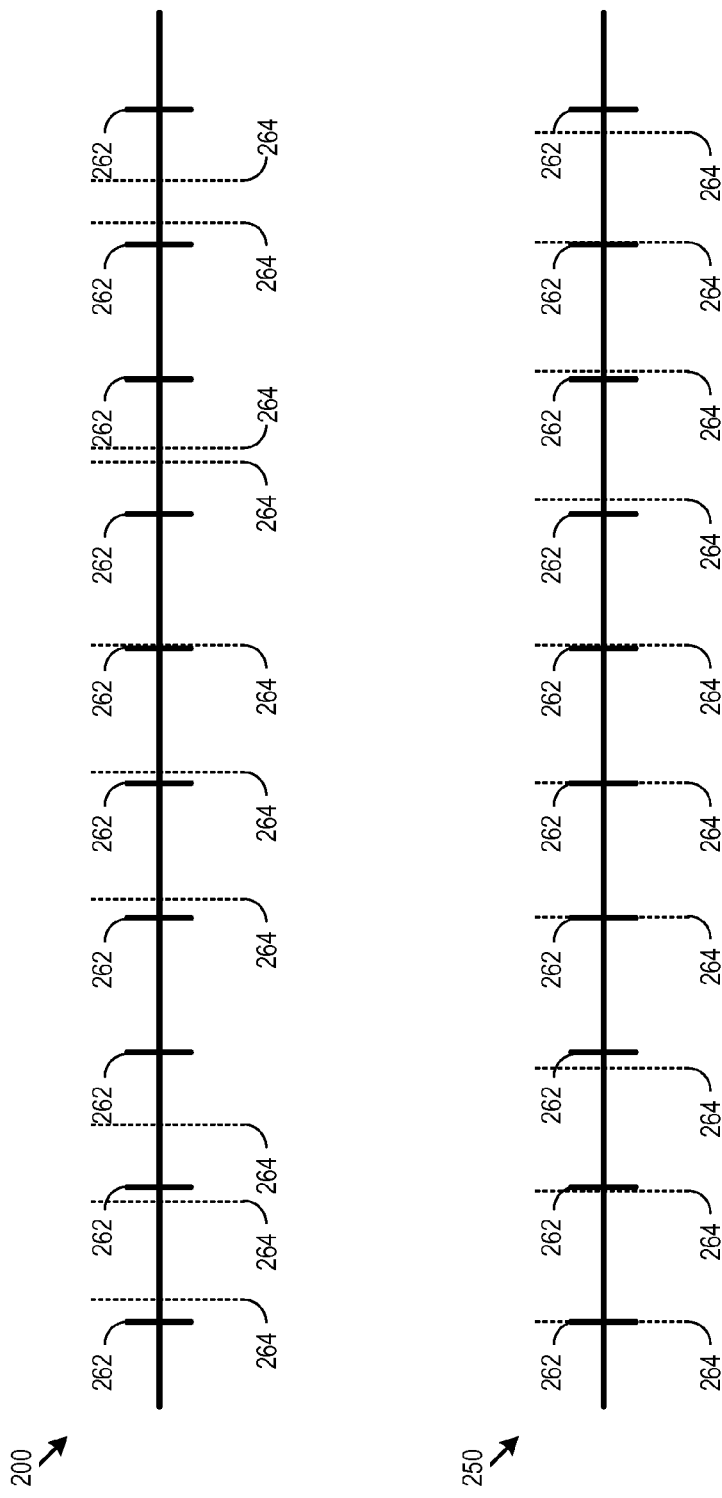
FIG. 2 shows example sets of relative delays.

In an example scenario, a time-interleaved ADC system of M interleaved ADCs capable of sampling at N Hz may be sampling an incoming signal with a bandwidth of N*M Hz. For example, an interleaved set of 16 4 gigasample per second (Gs) ADCs may sample an incoming signal at 64 Gs. The M interleaved ADCs may use relative delays established to uniformly sample the N*M Hz signal. FIG. 2 shows example sets 200, 250 of delays shown relative to target timing points 262. In the first example set 200, the relative delays of the timing points 264 are affected by the process variation among the timing circuitry of the ADCs. The timing points 264 are skewed by different amounts of time from the target timing points 262 in accord with the process variation among the ADCs. The skew may cause distortion in the sampled output of the ADCs. The second example set 250 of relative delays shows the effect of process variation mitigation via PMT circuitry on the timing points 264. The deviations of the positions of the timing point relative to the target timing points 262 may be reduced. As a result, the interleaved ADCs sample the high bandwidth signal more uniformly, leading to a more accurate analog to digital conversion of the high bandwidth signal.

The process variation from transistor and/or resistor elements within the timing circuitry of the ADCs may be mitigated. The process variation contributed by transistor and/or resistor elements may be up to 30% or more. The process variation associated with capacitor elements may be up to 10%. The techniques described below help reduce the process variation from transistor and resistor elements by regulating the current response of these elements. As a result, the process variation exhibited by a device using these techniques may be similar to the process variation associated with capacitor elements.

Figure 3:
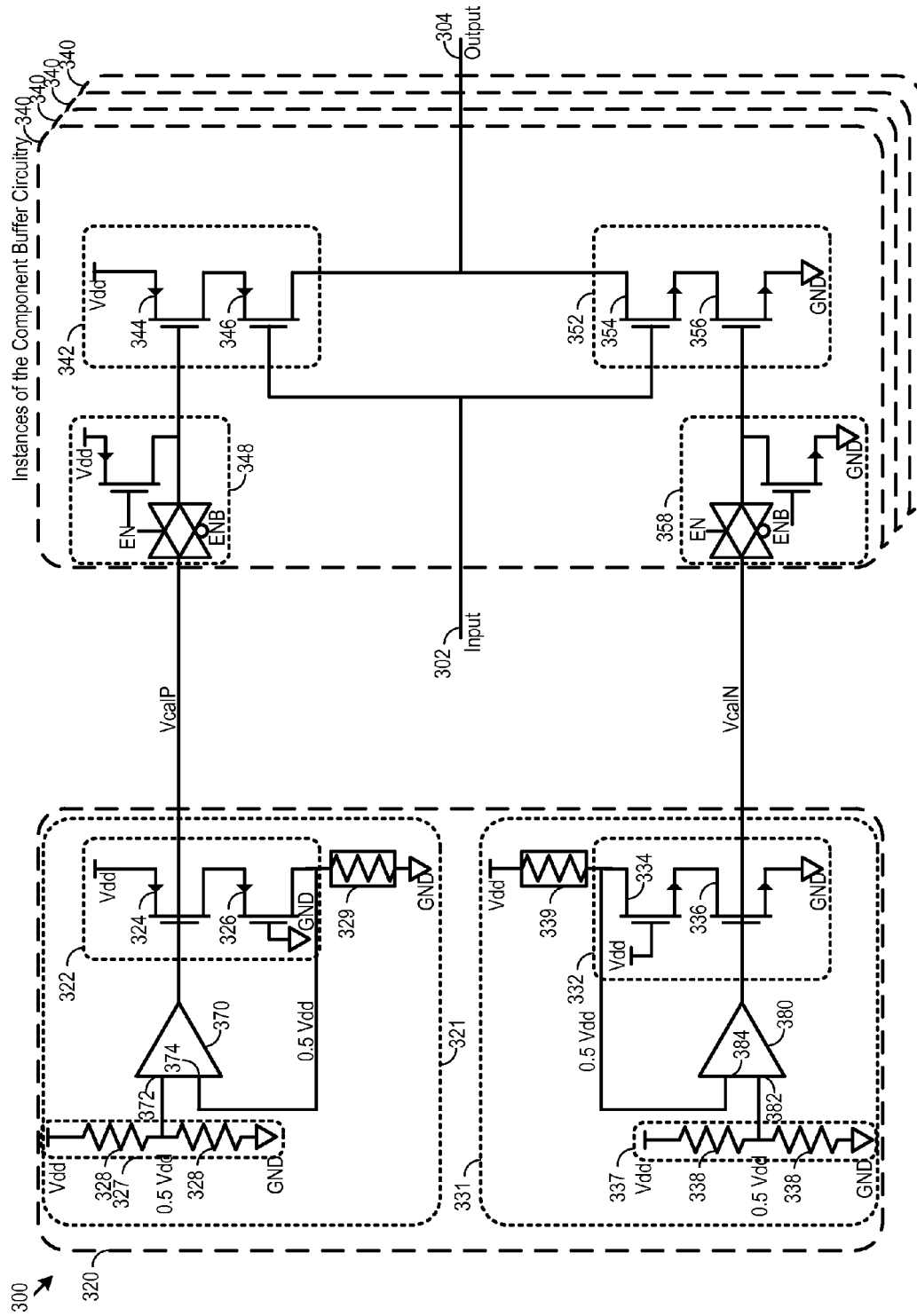
FIG. 3 shows example process mitigating buffer circuitry

FIG. 3 shows example process mitigating buffer (PMB) circuitry. The example PMB circuitry 300, may include replica circuitry 320 and multiple component buffer circuits 340. The component buffer circuits 340 may be coupled to an input 302 and an output 304. In some cases, the component buffer circuits 340 may be coupled in parallel between the input 302 and the output 304. The individual component buffer circuits may include a positive metal oxide semiconductor (PMOS) circuit 342 and a negative metal oxide semiconductor (NMOS) circuit 352. The PMOS circuit 342 may include PMOS buffer transistors 344, 346. In some implementations, PMOS transistor 344 may include a low dropout (LDO) transistor. The LDO transistor 344 may, for instance, modulate the strength of current conduction of the buffer. The LDO transistor 344 may be controlled via a calibration loop formed by the replica circuitry 320, the Op-amp 380 and the reference voltage, discussed below. For example, at slow PVT corners the calibration loop may set the LDO transistor 344 bias such that the LDO transistor 344 conducts more current. The increased current may speed up the response speed of the component buffer circuits 340. In the example, at fast PVT corners the calibration loop may set the LDO transistor 344 bias to restrict current flow in the component buffer circuits 340. The reduced current flow may slow down the response of the buffer.

The NMOS circuit 352 may include NMOS transistors 354, 356. In some implementations, NMOS transistor 354 may include an LDO transistor and NMOS transistor 356 may include a SLICE transistor.

The component buffers 340 may be enabled or disabled using enable switches 348, 358. When the example PMB circuitry 300 is enabled, switch 348 allows the gate of PMOS transistor to be set to VcalP, the PMOS portion of the calibration bias voltage. When disabled, switch 348 pulls the gate of transistor 344 to Vdd (high). Similarly, switch 358 allows the gate of transistor 354 to be set to VcalN, the NMOS portion of the calibration bias voltage, when the PMB circuitry is enabled. When disabled, switch 358 pull the gate of transistor 354 to ground (low).

The replica circuitry 320 may provide the calibration bias voltage to the multiple component buffer circuits 340. The calibration voltage may comprise a differential voltage. The opposing voltages, VcalP and VcalN, making up the calibration bias voltage may be provided by a positive complement circuit 321, and a negative complement circuit 331. In some implementations, the complement circuits 321, 331 may provide a common bias voltage to multiple component buffer circuits 340. In other words, the component buffer circuits 340 may be coupled to the replica circuitry 320 in parallel such that individual instances of the component buffer circuits receive the same calibration bias voltage. The positive complement (PC) circuit 321 may include a structurally-matched (SM) PMOS circuit 322. The SM-PMOS circuit 322 may structurally match the PMOS circuit 342 of the component buffer circuits 340. The transistors 324, 326 of SM-PMOS circuit 322 may include transistors matched in type and operation to transistors 344 and 346 of NMOS circuit 352.

In some implementations, the current response of the SM-PMOS circuit 322 may be similar to that of PMOS circuit 342. For example, the SM-PMOS circuit 322 may exhibit the similar process variation to that of the PMOS circuit 342 because they are fabricated on the same integrated circuit. For example, if PMOS circuit 342 is fast because of process variation, SM-PMOS circuit 322 may also be fast.

In some implementations, VcalP, which is supplied to the gates of transistors 324, 344, may be regulated by split circuit 327 and calibrated resistor 329. The calibrated resistor 329 may be a resistor having a known, controlled resistance. For example, the calibrated resistor 329 may include multiple switchable component resistors which may be switched on or off to change the final total value of the resistance.

The split circuit 327 may include identical resistors 328. The identical resistors 328 have the same resistance such that terminal 372 of op-amp 370 may be held at a reference voltage, 0.5 Vdd. In other words, terminal 372 is held halfway between the supply voltage (Vdd) and ground (GND). Terminal 374 may be pulled to the reference voltage, 0.5 Vdd, by the operation of the op-amp. The current flowing through calibrated resistor 329 is defined by the resistance calibrated resistor and the known voltage at terminal 374, 0.5 Vdd. Therefore, VcalP may be the voltage that supplies the defined current. If transistors 324, 326 are fast or slow, the value of VcalP corresponding to the defined current may change accordingly. If transistors 324, 326 are fast/slow then transistors 344, 346 will also be fast/slow and the adjustment to VcalP may compensate for this process variation.

NMOS Complement (NC) circuit 331 may operate similarly to PC circuit 321. NC circuit 331 may include SM-NMOS circuit 332, which is structurally matched to NMOS circuit 354. NC circuit may further include split circuit 337 and calibrated resistor 339 to regulate VcalN. Op-amp 380 may hold terminal 374 at 0.5 Vdd and supply VcalN in accord with the current defined by 0.5 Vdd and the resistance of calibrated resistor 339.

In the example PMB circuit 300, the PC circuit 321, as shown, sets the buffer threshold point at the reference voltage, 0.5 Vdd. In various implementations, other threshold points may be used. However, 0.5 Vdd may be an advantageous selection since split circuit 327 may produce 0.5 Vdd at terminal 372 regardless of the process variation of identical resistors 328. For other threshold values, identical resistors 328 may be set to different resistance values. Similarly differing resistance values for identical resistors 338 may be used in split circuit 337 of NC circuit 331.

Figure 4:
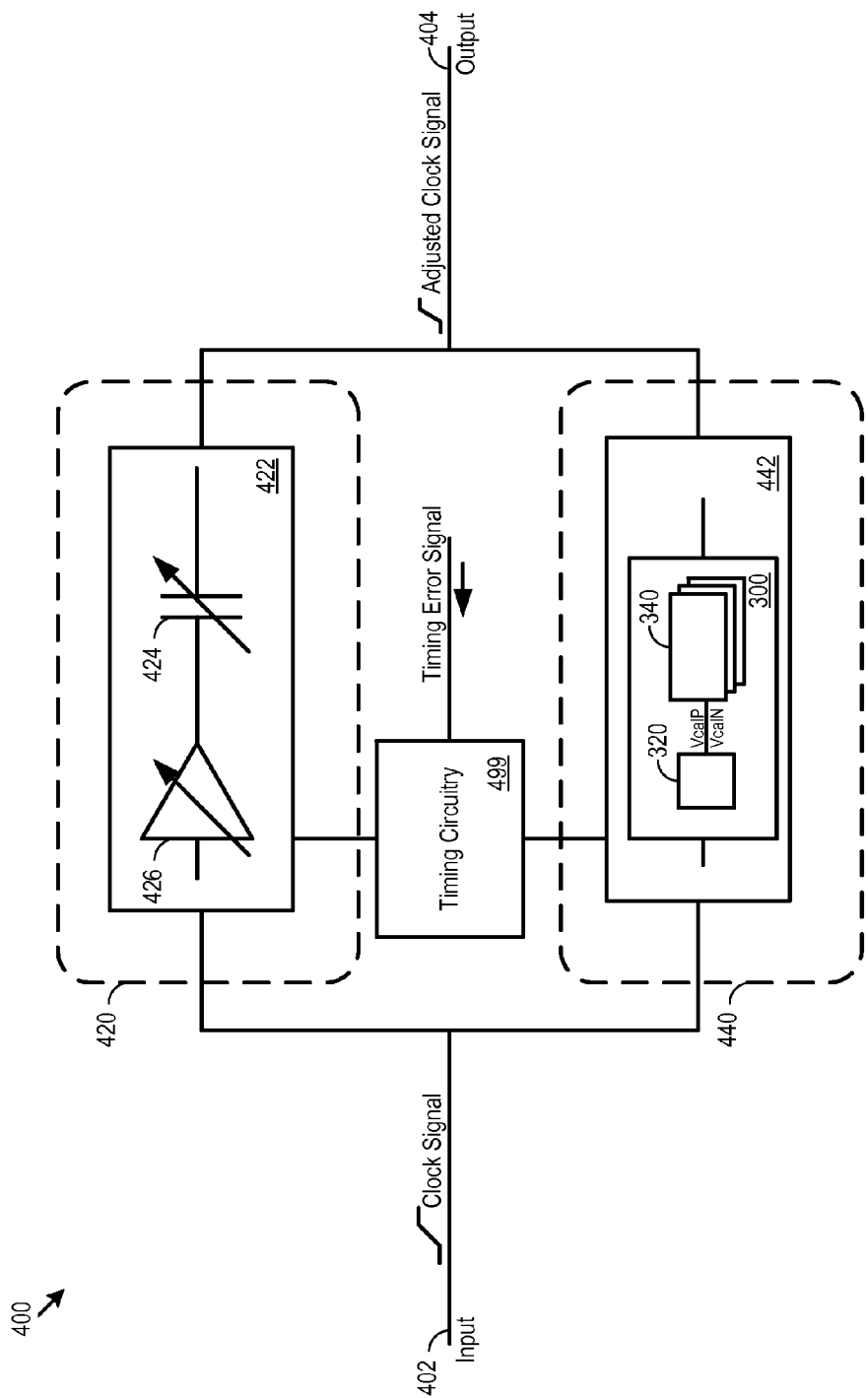
FIG. 4 shows example process mitigating timing circuitry.

FIG. 4 shows example PMT circuitry 400. In the example PMT circuitry 400, an input node 402 distributes a clock signal to paths 420, 440 situated in parallel. The fine tuning path 420 may include capacitance buffer circuitry 422, which may provide a tunable capacitance. The tunable capacitance may be implemented using a set 424 of component capacitors coupled to respective component buffer circuits making up a variable buffer 426.

The individual buffer circuits of the variable buffer 426 may accept individual enable signals from the timing circuitry 499. The enable signals may enable or disable the component buffer/component capacitor pairs. Enabling component capacitors may cause a relative advancement of the clock signal at the output node 404. In various implementations, the component buffer circuits of the variable buffer may be selected to provide a current response large enough to drive the component capacitors across all process corners. Selecting such component buffer circuits may result in the component capacitors to provide the largest portion of the process variation of the capacitance buffer circuitry 422. In other words, the speed of the capacitance buffer circuitry 422 may reflect the speed of the component capacitors, which may have lower process variation than transistor or resistor elements in the capacitance buffer circuitry. Additionally or alternatively, the component buffer circuits of the variable buffer 426 may be calibrated using replica circuitry and function as PMB circuitry 300, as described above.

The coarse tuning path 440 may combine with the fine tuning path 420 at the output node 404. The combined signal from the paths 420, 440 may form the output of the PMT circuitry 400.

The coarse tuning path 440 may include impedance buffer circuitry 442. The impedance buffer circuitry 442 includes PMB circuitry 300. The impedance buffer circuitry 442 generates a calibrated current response that corresponds to a selected impedance. The impedance buffer circuitry may include component buffer circuits 340 which may be enabled or disabled by the timing circuitry.

In some implementations, various instances of the component buffer circuits 340 may be fixed in an enabled or disabled state. For example, a portion of the component buffer circuits 340 may by fixed in the enabled or disabled state and a second portion may be selectively and individually enabled and disabled by the timing circuitry 399. The timing circuitry 499 may switch individual instances of the component buffer circuits 340 to tune the selected impedance of the impedance buffer circuitry 442. Increasing the number of enabled component buffer circuits 340 may reduce the output impedance of the impedance buffer circuitry and cause a relative advancement of the clock signal. In various implementations, enabling or disabling a circuit of the impedance buffer circuitry 442 may have a larger effect on the clock signal than enabling or disabling a circuit of the capacitance buffer circuitry. Thus, coarse timing adjustment may be achieved through impedance buffer circuitry and fine timing adjustment may be achieved through the capacitance buffer circuitry.

The timing circuitry 499 may receive a timing error signal. The timing error signal may include an indication of the synchronization status of the device that is controlled by the clock signal output of the PMT circuitry. Based on the indication, the timing circuitry may enable or disable component capacitor-buffer pairs of the capacitance buffer circuitry 422 and/or component buffer circuits of the impedance buffer circuitry 442. For example, the timing circuitry 499 may adjust the capacitance buffer circuitry 422 and impedance buffer circuitry to reduce the timing error signal. However, virtually any signal scheme for indicating timing synchronization may be used.

In some implementations, the PMT circuitry may have a range over which the PMT circuitry may adjust the timing and a fine tuning step which may be used to traverse the range. For example, a range of on the order of picoseconds may be stepped through at a fine tuning step size of tens of femtoseconds. Other ranges and fine tuning step sizes may be used. In various implementations, the process variation mitigation of the PMT circuitry may ensure that the range and step are similar across the PMT circuitry in a group of time-interleaved ADCs.

Figure 5:
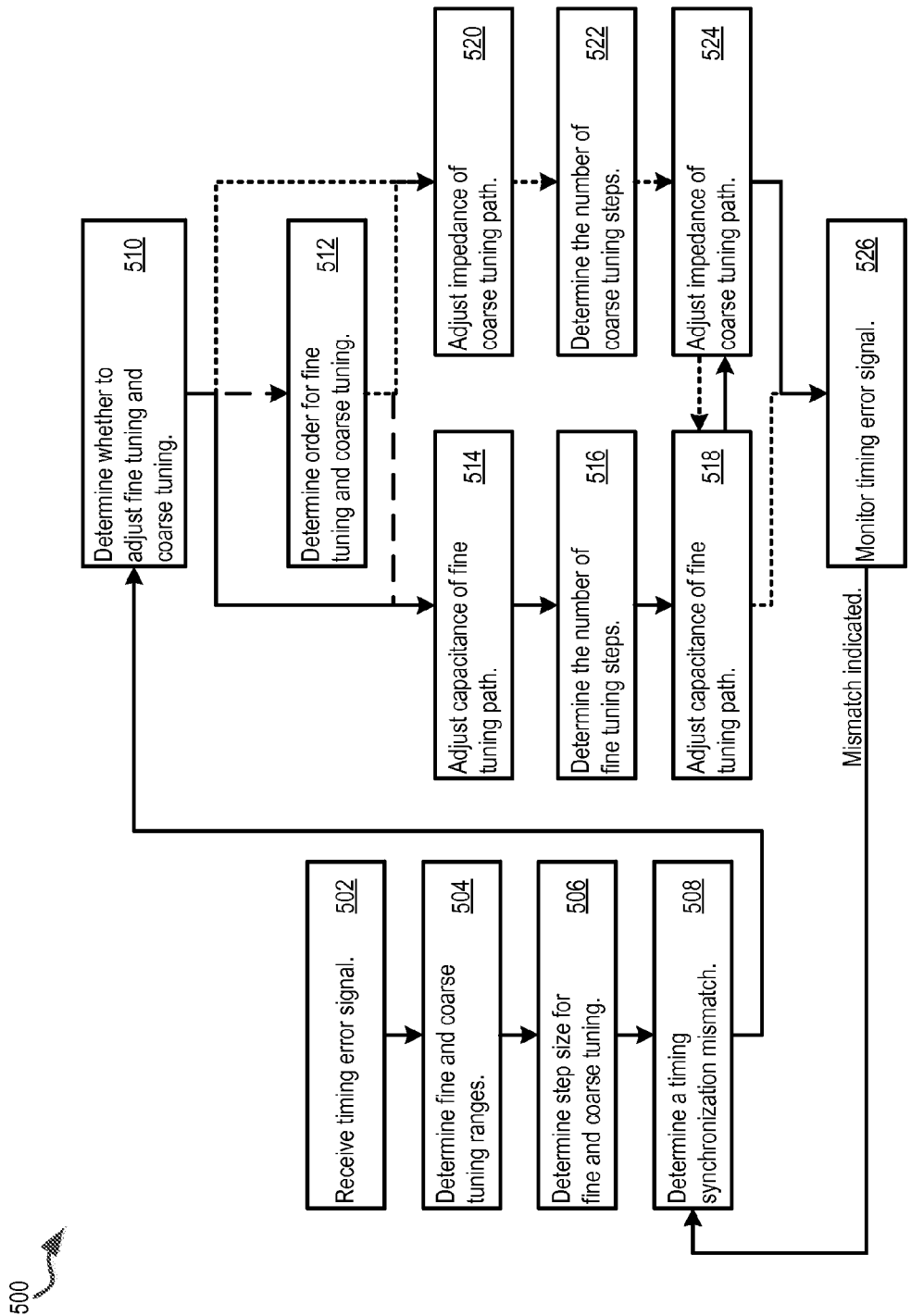
FIG. 5 shows example logic for adjusting signal timing.

FIG. 5 shows example logic 500 for adjusting signal timing. The timing circuitry 499 may receive a timing error signal (502). The timing circuitry 499 may determine the coarse tuning range and the fine tuning range (504). The timing circuitry 499 may determine the step size for the coarse steps and fine steps (506). Based on timing error signal the timing circuitry may determine a timing synchronization mismatch (508). Based on the determined mismatch, ranges, and/or step sizes, the timing circuitry 499 may determine whether to adjust the fine tuning or coarse tuning, or both (510). In some cases, when both fine tuning and coarse tuning are determined to performed, the timing circuitry 499 may also determine the order for preforming the fine tuning and the coarse tuning (512).

When fine tuning is determined to be performed, the timing circuitry 499 may adjust the capacitance of the fine tuning path 420 (514). To adjust the fine tuning, the timing circuitry may determine the number of fine tuning steps to use (516). Once the number of fine tuning steps is determined, the timing circuitry 499 may send enable or disable signals to a corresponding number of component capacitors (518). When coarse tuning is determined to be performed, the timing circuitry 499 may adjust the impedance of the course tuning path 440 (520). To adjust the coarse tuning, the timing circuitry may determine the number coarse tuning steps to use (522). Once the number of fine tuning steps is determined, the timing circuitry 499 may send enable or disable signals to a corresponding number of component buffer circuits 340 (524). After adjustment, the timing circuitry 499 may continue to monitor the timing error signal (526). If the timing error signal continues to indicate a timing synchronization mismatch, the timing circuitry may return to 508.

In some implementations, the timing circuitry 499 may perform adjustment without first determining a specific adjustment to execute. For example, the timing circuitry may adjust the capacitance of the capacitance buffer circuitry 422 until reaching the end of a range of adjustment. After reaching the end of the range for fine tuning, the timing circuitry may return the fine tuning circuitry to a mid-point of its range and increment the coarse tuning circuitry. The timing circuitry may continue alternating fine and coarse adjustment until the timing mismatch is minimized.

In the implementation shown in FIG. 2, the target timing points are evenly distributed. In various implementations, other target timing point distributions may be used.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

What is claimed is:
1. A circuit, comprising:
a clock output node;
a clock input node;
replica circuitry comprising a calibrated resistor, the replica circuitry configured to:
produce a reference voltage from a supply voltage input; and generate a calibrated voltage using the reference voltage and calibrated resistor;
impedance buffer circuitry coupled to the clock input node and the clock output node, and configured to:
receive the calibrated voltage; and
apply the calibrated voltage as a bias to produce a calibrated impedance coupled to the clock output node; and
capacitance buffer circuitry coupled to the clock input node and the clock output node, and comprising an output capacitance coupled to the calibrated impedance.

2. The circuit of claim 1, wherein impedance buffer circuitry is configured to produce the calibrated impedance using a selectable current response.

3. The circuit of claim 1, wherein the impedance buffer circuitry comprises multiple instances of component buffer circuitry.

4. The circuit of claim 3, wherein one or more of the multiple instances comprises switchable instances, the switchable instances configured to be enabled via assertion of an enable signal.

5. The circuit of claim 4, wherein the replica circuitry comprises a first circuit structurally matched to a second circuit within the component buffer circuitry.

6. The circuit of claim 5, wherein a current response of the first circuit is configured to drive adjustment of the calibrated voltage.

7. The circuit of claim 1, wherein the output capacitance comprises a tunable capacitance and the impedance buffer circuitry comprises tunable impedance buffer circuitry.

8. The circuit of claim 7, wherein:
the tunable capacitance allows for fine adjustment for advancing a clock signal supplied by the clock input node; and
the tunable impedance buffer circuitry allow for coarse adjustment for advancing the clock signal.

9. The circuit of claim 1, further comprising an integrated circuit comprising the replica circuitry and the impedance buffer circuitry.

10. The circuit of claim 1, wherein:
the replica circuitry comprises a first circuit and a second circuit;
the calibrated voltage comprises a differential voltage comprising a first voltage and a second voltage;
the first circuit is configured to produce the first voltage; and
the second circuit is configured to produce the second voltage.

11. The circuit of claim 10, wherein the first circuit comprises a complement circuit of the second circuit.

12. The circuit of claim 10, wherein:
the first circuit comprises the calibrated resistor; and
the second circuit comprises another calibrated resistor.

13. The circuit of claim 1, further comprising timing circuitry configured to:
receive a timing error signal;
determine to adjust a clock signal supplied by the clock input node; and cause the impedance buffer circuitry to adjust a delay of the clock signal responsive to the timing error signal.

14. The circuit of claim 13, wherein the timing circuitry is configured to synchronize an analog-to-digital converter (ADC) via the adjustment of the delay.

15. The circuit of claim 13, wherein the timing circuitry is configured to synchronize the ADC to multiple ADCs, the multiple ADCs configured to perform parallel sampling of portions a single datastream.

16. A device, comprising:
a first analog-to-digital converter (ADC) circuit and a second ADC circuit, the first ADC circuit comprising:
replica circuitry configured to produce a calibrated bias voltage;
impedance buffer circuitry configured to:
receive the bias voltage; and
produce a calibrated current response to supply a selected output impedance responsive to the calibrated bias voltage;
capacitance buffer circuitry configured to cooperate with the impedance buffer circuitry adjust a delay of a clock signal via a tunable capacitance and the selected output impedance; and
timing circuitry configured to:
receive a timing error signal indicating a deviation from synchronization of the first ADC circuit with the second ADC circuit; and
cause the impedance buffer circuitry and the capacitance buffer circuitry to adjust the clock signal responsive to the timing error signal.

17. The device of claim 16, wherein:
the replica circuitry further comprises a calibrated resistor; and
the replica circuitry is configured to generate the calibrated bias voltage based on the calibrated resistor.

18. The device of claim 16, wherein a first circuit of the replica circuitry is structurally matched to a second circuit of the impedance buffer circuitry, a current response of the first circuit configured to drive adjustment of the calibrated bias voltage.

19. The device of claim 16, wherein the first and second ADC circuits comprise fractional bit-rate ADCs sampling a single datastream.

20. A device, comprising:
a clock output node;
a clock input node configured to supply a clock signal;
a capacitance buffer circuitry coupled to the clock input node and clock output node, characterized by a tunable capacitance;
replica circuitry comprising a calibrated resistor, the replica circuitry configured to:
receive a supply voltage input;
divide the supply voltage input to produce a reference voltage; and
generate a calibrated voltage using the reference voltage, calibrated resistor, a first circuit, a current response of the first circuit configured to drive adjustment of the calibrated voltage; and
tunable impedance buffer circuitry coupled to the capacitance buffer circuitry, the clock input node and the clock output node, the tunable impedance buffer circuitry comprising multiple instances of component buffer circuitry, the component buffer circuitry comprising a second circuit structurally matched to the first circuit, the tunable impedance buffer circuitry configured to:
receive the calibrated voltage at individual ones of the multiple instances; and
apply the calibrated voltage as a bias to produce a calibrated current response, the calibrated current response corresponds to a selected output impedance for the tunable impedance buffer circuitry;
activate an individual one of the multiple instances to adjust the selected output impedance; and
produce a combined output with the capacitance buffer circuitry at the output node, the combined output configured to adjust a delay of the clock signal responsive to the tunable capacitance and the selected output impedance; and timing circuitry configured to:
   receive a timing error for the clock signal; and
   cause the tunable impedance buffer circuitry and the capacitance buffer circuitry to adjust the clock signal responsive to the timing error.

\* \* \* \* \*